United States Patent
Klingberg et al.

(10) Patent No.: US 7,557,652 B2
(45) Date of Patent: Jul. 7, 2009

(54) POWER AMPLIFIER SYSTEM

(75) Inventors: Mats Klingberg, Enskede (SE); Richard Hellberg, Huddinge (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 89 days.

(21) Appl. No.: 11/722,191

(22) PCT Filed: Dec. 21, 2004

(86) PCT No.: PCT/SE2004/001954
§ 371 (c)(1), (2), (4) Date: Jun. 20, 2007

(87) PCT Pub. No.: WO2006/068546
PCT Pub. Date: Jun. 29, 2006

(65) Prior Publication Data
US 2008/0007330 A1    Jan. 10, 2008

(51) Int. Cl.
*H03F 3/68* (2006.01)
(52) U.S. Cl. .................................. 330/124 R
(58) Field of Classification Search ............. 330/124 R, 330/126, 295
See application file for complete search history.

(56) References Cited

U.S. PATENT DOCUMENTS 5,751,250 A * 5/1998 Arntz ........................ 342/373
7,071,775 B2 * 7/2006 Gailus et al. ............ 330/124 R

FOREIGN PATENT DOCUMENTS

WO   WO 03/061115 A1   7/2003
WO   WO 2004/057755 A1   7/2004

OTHER PUBLICATIONS

H. Chireix, "High Power Outphasing Modulation", Proc. IRE, vol. 23, No. 2, pp. 1370-1392, Nov. 1935.
W. H. Doherty, "A New High Efficiency Power Amplifier for Modulated Waves", Proc. IRE, vol. 24, No. 9, pp. 1163-1182, Sep. 1936.

* cited by examiner

*Primary Examiner*—Steven J Mottola

(57) ABSTRACT

A multiple input multiple output power amplifier system includes multiple main amplifiers for amplifying corresponding independent input signals. A common control unit forms a composite signal from the independent input signals. The composite signal is amplified by a peaking amplifier and forwarded to an output network where main amplifier output signals are combined with amplified composite signals into multiple power amplifier output signals.

5 Claims, 8 Drawing Sheets

POWER AMPLIFIER SYSTEM

TECHNICAL FIELD

The present invention relates to an efficient multiple input multiple output power amplifier system.

BACKGROUND

In transmitters for wireless communications systems, the power amplifiers (PAs) often have to simultaneously amplify many radio channels (frequencies), which are spread across a fairly wide bandwidth. They also have to do this efficiently, in order to reduce power consumption and need for cooling. High linearity is also required, since nonlinear amplifiers would cause leakage of interfering signal energy to other channels in the system.

The amplitude probability density of a mix of sufficiently many independent radio frequency (RF) channels, or of a multi-user Code Division Multiple Access signal (CDMA signal), tends to be close to a Rayleigh distribution having a large peak-to-average power ratio. Since a conventional RF PA generally has an efficiency proportional to its output amplitude, its average efficiency is very low for such signals.

In response to the low efficiency of conventional linear PAs, many methods have been proposed. Two of the most promising are the Chireix outphasing method [1] and the Doherty method [2], which are based on composite power amplifiers including more than one amplifier.

Base stations for wireless communications systems are often equipped with several transmitters (and therefor several power amplifiers). Reasons for this can be that the base station is serving several geographical areas ('sectors' or 'cells') or that an array of several antenna elements is used. In the first case the number of independent transmitters is typically three. Combinations of the two methods are also possible.

In the case of a three-sector base station, the three antennas usually output totally independent signals (three different mixtures of signals to users in specific sectors) amplified by three separate power amplifiers.

In the case of an antenna array, different users within a sector are at different locations, and therefore the signals to the individual antennas in the array (different mixtures of phase shifted versions of signals to users) are generally partly correlated. The correlation is generally higher for lower angular spread of users (narrower sectors) and smaller spacing between the antennas. Also in this case separate power amplifiers are used for each antenna in the array.

As noted above state of the art power amplifiers (Chireix and Doherty type amplifiers) achieve higher efficiency than class B amplifiers by having two or more independently controlled constituent amplifiers (transistors) per composite amplifier. A problem with this approach is the large number of control paths (signal generation, up-conversion, amplification, etc) when the amplifiers are used in multiple input multiple output applications, such as multisector base stations or adaptive antenna arrays. This is due to the fact that each composite amplifier requires at least twice the number of control paths as compared to compared to a non-composite amplifier.

SUMMARY

An object of the present invention is to obtain high efficiency of a multiple input multiple output power amplifier system using a lower number of control paths than the prior art systems.

This object is achieved in accordance with the attached claims.

Briefly, the present invention is based on the idea that a control path can be shared by several composite amplifiers.

BRIEF DESCRIPTION OF THE DRAWINGS

The invention, together with further objects and advantages thereof, may best be understood by making reference to the following description taken together with the accompanying drawings, in which.

DETAILED DESCRIPTION

Figure 1:
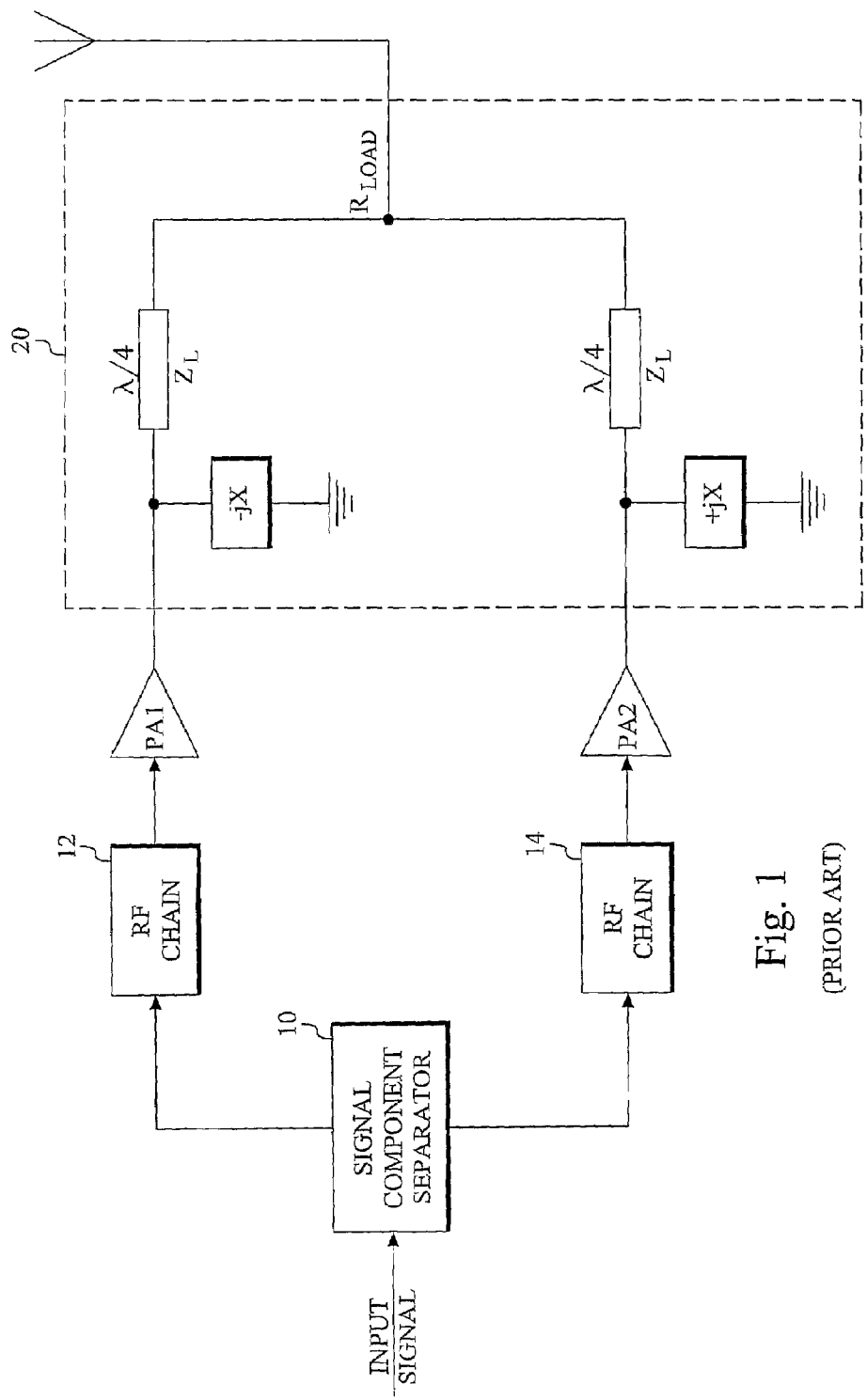
FIG. 1 is a block diagram of a Chireix amplifier.

In the following detailed description of the present invention the same reference designations will be used for equivalent or similar elements illustrated in the drawings.

Before the present invention is described in detail, the Chireix and Doherty amplifiers and the underlying problem will be briefly illustrated.

The term "outphasing", which describes the key method in Chireix amplifiers, generally means the method of obtaining amplitude modulation by combining several (generally two) phase-modulated constant-amplitude signals. As shown in FIG. 1, these signals are produced in a signal component separator 10 and subsequently, after up-conversion and amplification through RF chains 12, 14 (D/A converters, mixers, filters) and amplifiers PA1, PA2, combined to form an amplified linear signal in an output combiner network 20. The phases of these constant-amplitude signals are chosen so that the result from their vector-summation yields the desired amplitude. The compensating reactances $+jX$ and $-jX$ in the output network of the Chireix amplifier are used to extend the region of high efficiency to lower output power levels.

Figure 2:
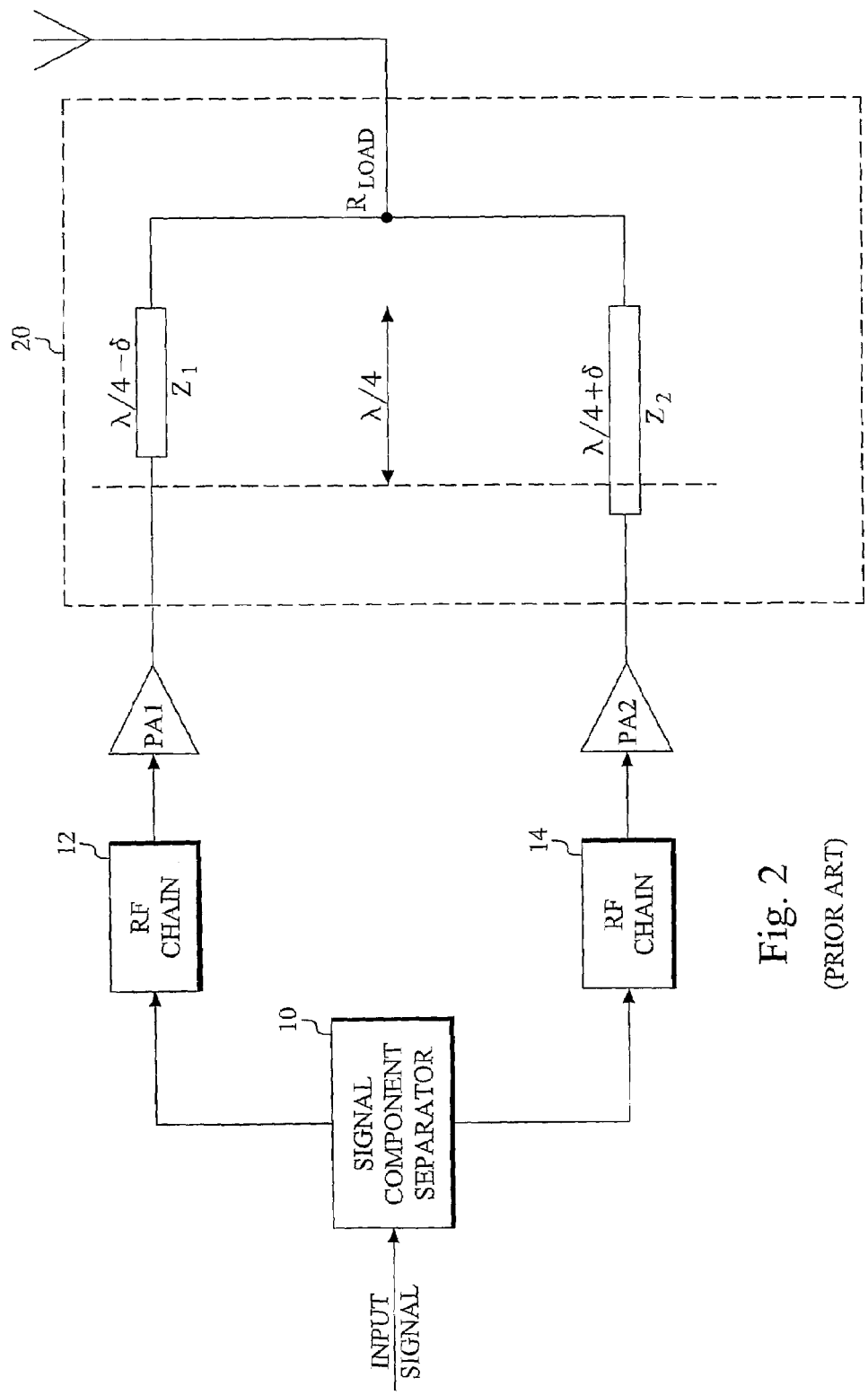
FIG. 2 is a block diagram of a Chireix amplifier with an output network implemented by transmission lines.

An advantage of the Chireix amplifier is the ability to change the efficiency curve to suit different peak-to-average power ratios, by changing the size (X) of the reactances. The peak output power is equally divided between the amplifiers irrespective of this adjustment, which means that equal size (equal maximum output power) amplifiers can be used. A Chireix amplifier can also be built by shortening and lengthening the $\lambda/4$-lines (see [3]), while keeping the sum of the two lines at $\lambda/2$, instead of using compensating reactances. A generic output network according to [3] is shown in FIG. 2.

Figure 3:
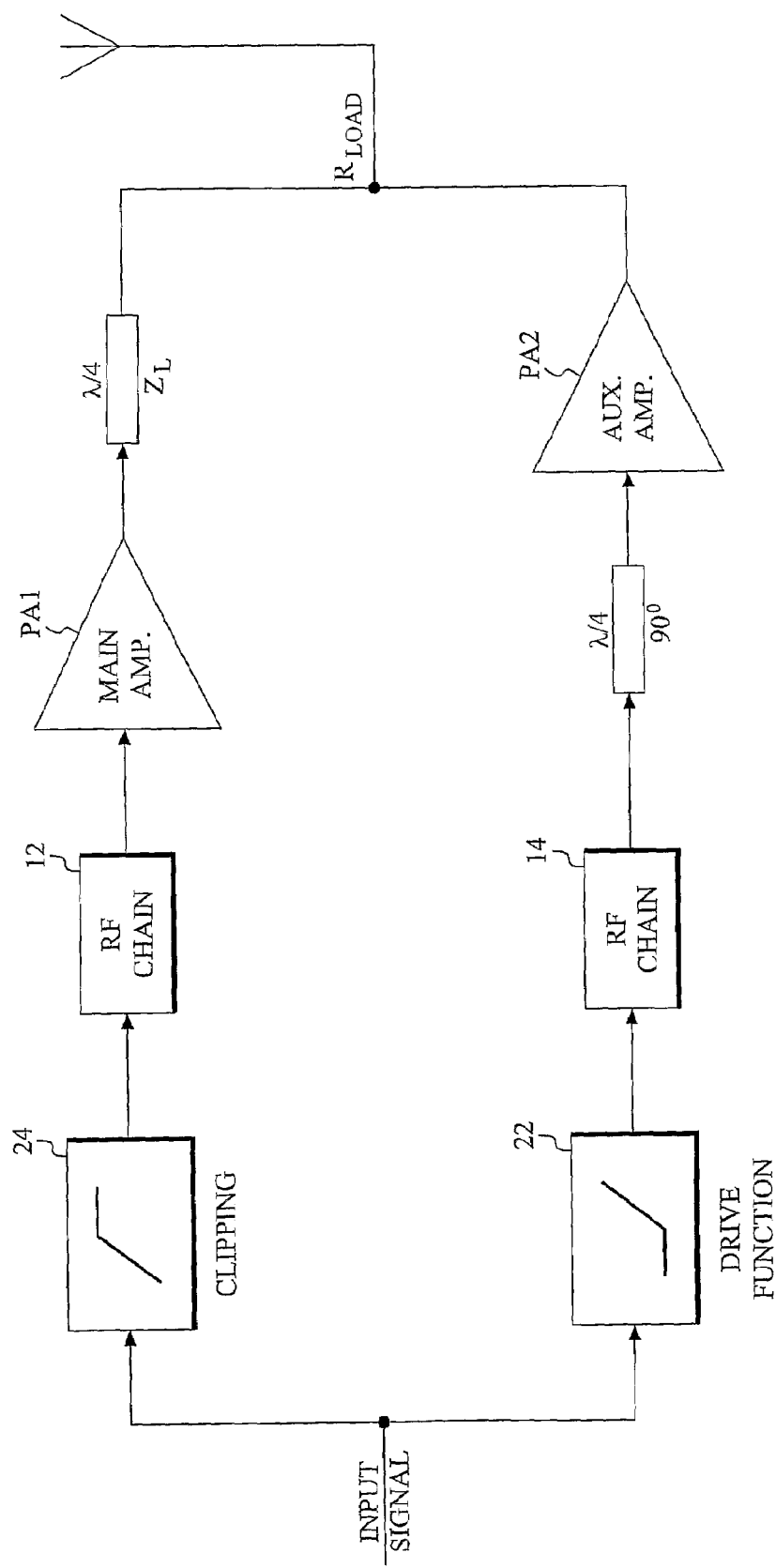
FIG. 3 is a block diagram of a Doherty amplifier.

The Doherty amplifier, of which a typical embodiment is shown in FIG. 3, uses one linear and one nonlinear amplifier. The published theory states that a first amplifier PA1 (i.e. transistor), denoted "main" power amplifier, is driven linearly in class B, and a second amplifier PA2, denoted "peaking" or "auxiliary" power amplifier, having nonlinear output current (through class C operation or some other technique), "modulates" the impedance seen by the main amplifier PA1 through the impedance-inverting quarter-wave (λ/4) line. Since the nonlinear output current of the auxiliary amplifier PA2 is zero below a so-called transition point at a certain output voltage, this amplifier does not contribute to the power loss below this point.

The standard Doherty amplifier's transition point is at half the maximum output voltage. With this transition point the efficiency curve is most suited for moderate peak-to-average power ratios, and the peak power is divided equally between the two constituent amplifiers. The transition point in the Doherty amplifier can be changed by changing the impedance of the quarter-wave transmission line (or equivalent circuit). The efficiency curve can then be adjusted for higher peak-to-average power ratios, and the peak output power will be unequally divided between the amplifiers. Different size (output power capacity) amplifiers will thus be needed for optimum utilization of the total available peak power.

Figure 4:
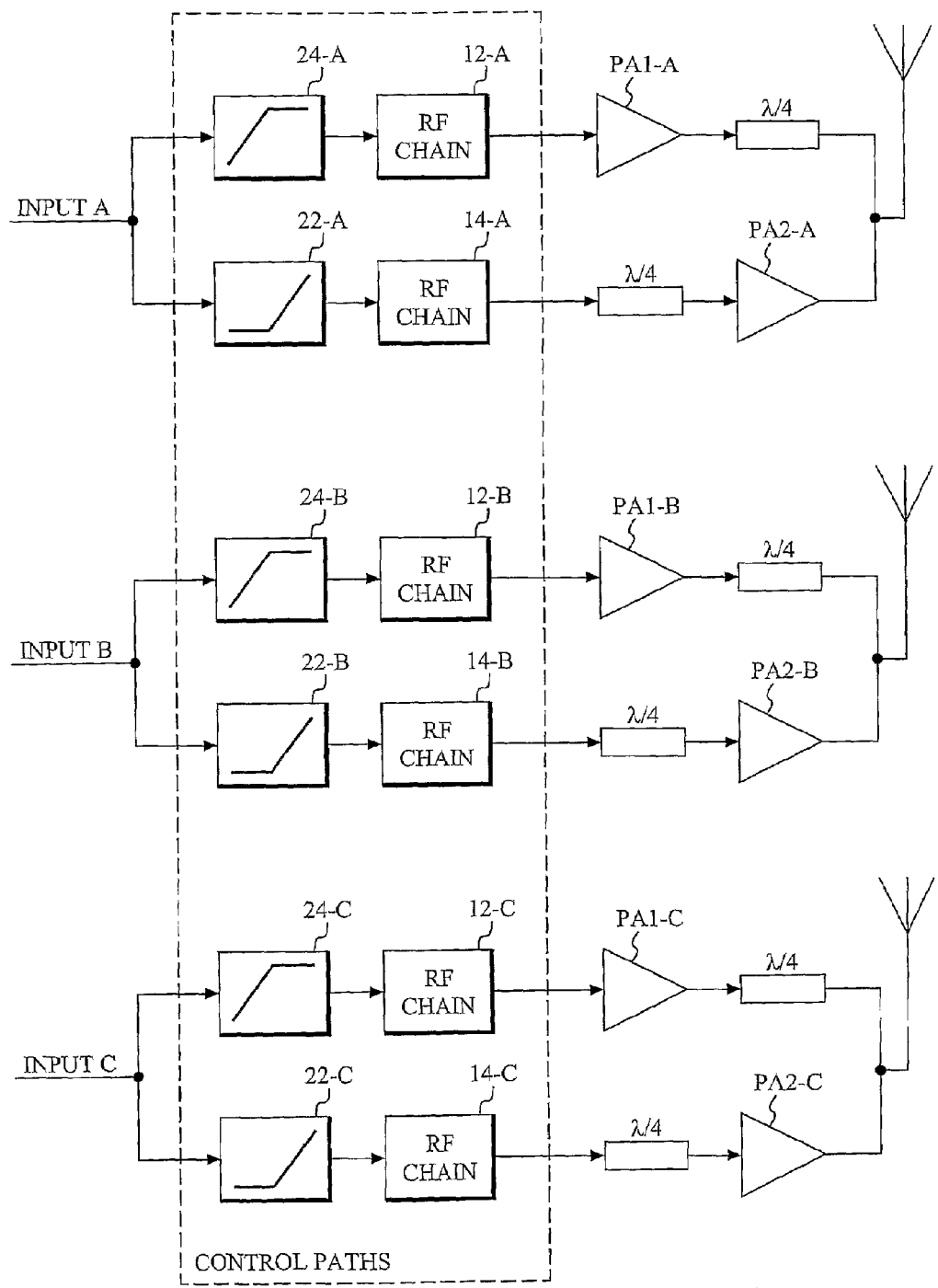
FIG. 4 is a block diagram of a typical prior art multiple input multiple output power amplifier system.

The state of the art amplifiers achieve higher efficiency than class B amplifiers by having two or more independently controlled transistors per composite amplifier. A problem with this approach is the large number of control paths (signal generation, up-conversion, amplification) when the amplifiers are used in a multi-sector base station or in an adaptive antenna array. This is illustrated in FIG. 4, in which three input signals A, B, C are forwarded to three independent Doherty amplifiers, each connected to an individual antenna. As may be seen from FIG. 4, each constituent amplifier requires its own control path, as indicated by the dashed rectangle. In effect, the three composite amplifiers are completely independent. The main problem solved by the invention is to obtain high efficiency using fewer such control paths.

Figure 5:
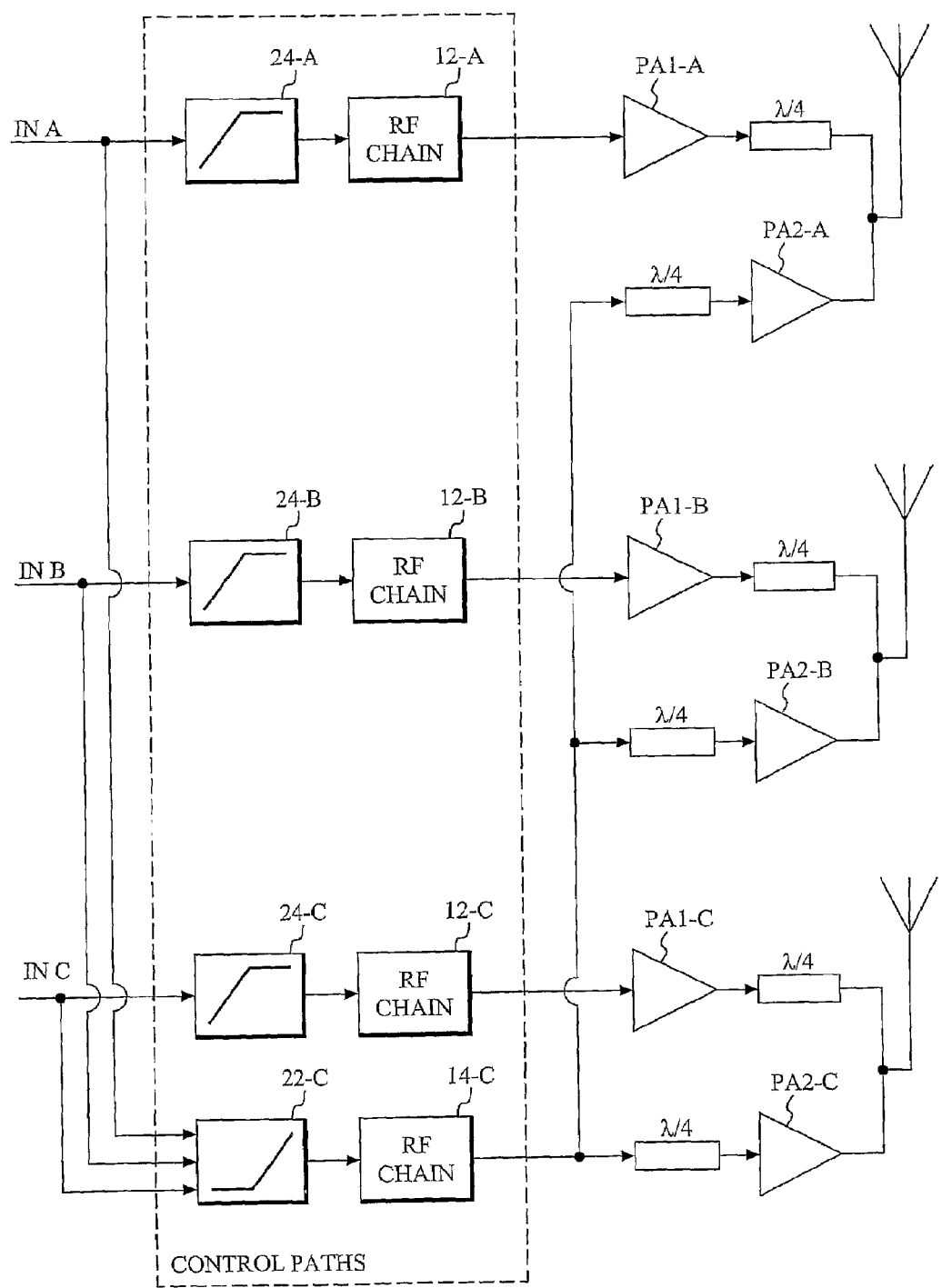
FIG. 5 is a block diagram of a first embodiment of a multiple input multiple output power amplifier system in accordance with the present invention.

FIG. 5 is a block diagram of a first embodiment of a multiple input multiple output power amplifier system in accordance with the present invention. This embodiment is based on the Doherty principle and has common control 22C over several peaking amplifiers PA2-A, PA2-B. PA2-C. This solves the problem of having many independent control paths that require separate up-converters, etc. In the present case the number of control paths can be reduced from 6 (FIG. 4) to 4 (FIG. 5). However, it is appreciated that not all peaking amplifiers have to be connected to the same control path. For example, PA2-B and PA2-C may share a common control path, whereas PA2-A may be configured with an independent control path as in FIG. 4.

Due to the shared control path, the peaking amplifier signals are always pointing in the same direction (or in different directions with the same phase offset between them), and therefore there is an extra error when two or more input signals A-C are above the transition point but in opposite phase directions. To make this occur more seldom (and with smaller error), the transition point should preferably be placed higher than in independent Doherty amplifiers.

Figure 6:
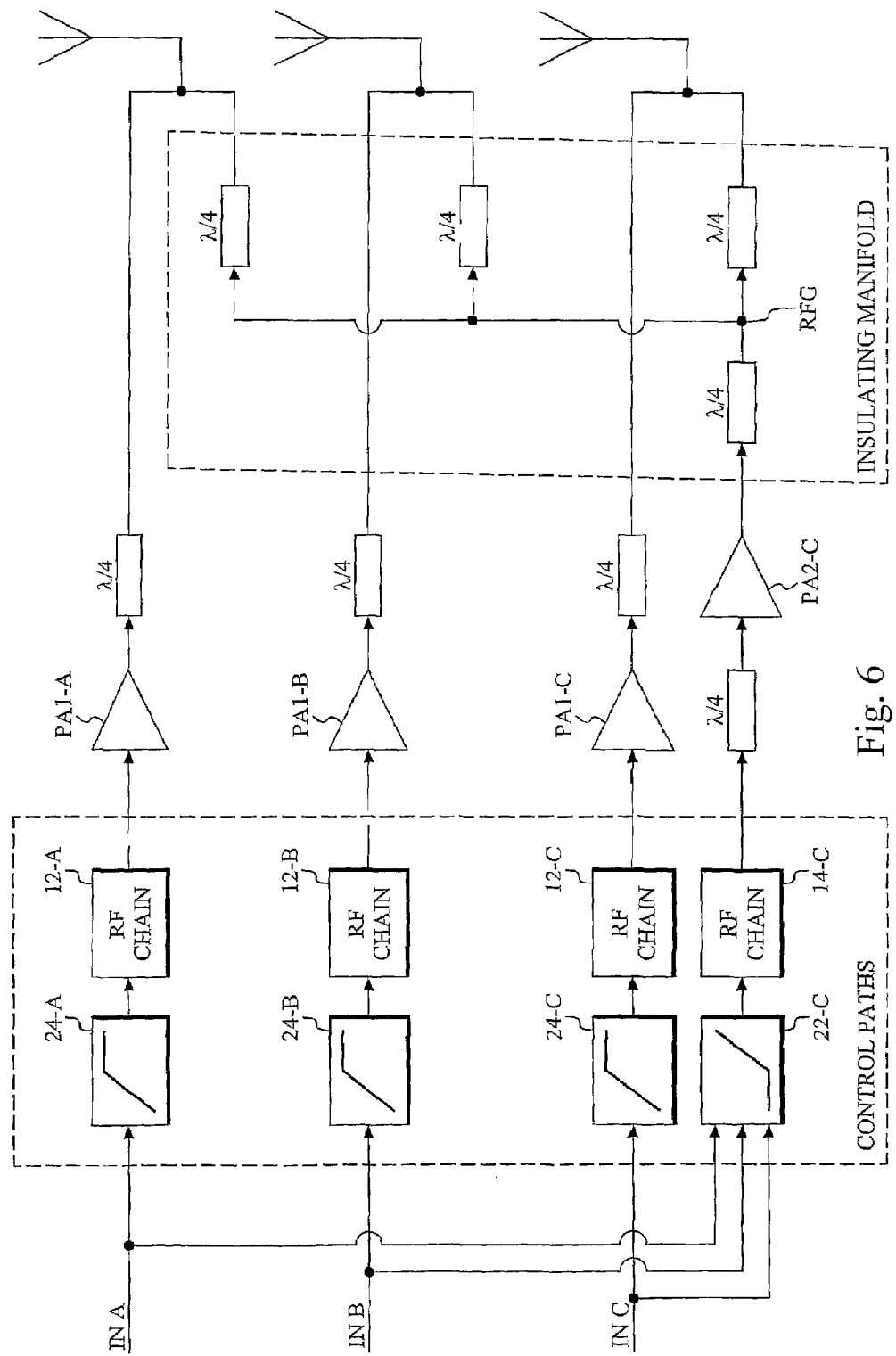
FIG. 6 is a block diagram of a second embodiment of a multiple input multiple output power amplifier system in accordance with the present invention.

Although the embodiment described with reference to FIG. 5 is a solution to the given problem, further improvements are possible. As noted, it reduces the number of control paths. However, the number of required peaking amplifiers is not reduced. FIG. 6 is a block diagram of a second embodiment of a multiple input multiple output power amplifier system in accordance with the present invention that achieves this further improvement.

The embodiment of FIG. 6 is based on a new output network, an "insulating manifold" that enables sharing of one peaking amplifier among several Doherty amplifiers. The basic condition for this to work is that the different output signals seldom need to use the peaking amplifier simultaneously and in opposite directions, RF voltage-wise. (The same condition applies to the previously described embodiment in FIG. 5.) In the embodiment shown in FIG. 6, the previously used individual peaking amplifiers have been replaced by a single peaking amplifier PA2-C, the output of which is connected to a passive network (insulating manifold) that insulates the various output nodes from each other while distributing the (single) peaking amplifier current to each node.

The insulating manifold insulates the output voltages from each other by using quarter-wave transmission lines between the outputs and a common point RFG that acts like an RF ground. Since the common point is grounded, no signal can pass by it, and the quarter wave lines transform the zero impedance at the common point to infinite impedance at the outputs. The peaking transistor PA2-C is essentially a current generator having infinite impedance. This impedance is transformed by a quarter-wave line into the zero RF impedance required at the common point RFG. In the reverse direction this circuit presents a voltage that is a scaled sum of the output voltages at its input. Clipping this voltage (by saturating the transistor or by proper pre-processing of the signals) increases efficiency.

A further advantage of the embodiment of FIG. 6 is that the error level is lower for the same amount of available power capacity (i.e. sum of transistor sizes) as compared to the embodiment of FIG. 5.

Optimal operation of the present invention preferably involves joint control of the signals, including joint clipping with minimal resulting error. The joint statistics of multi-carrier or multi-user signals are such that for higher transition point levels, multiple signals are more seldom simultaneously above the transition point. Whenever several signals are above the transition point simultaneously and these signals are in substantially opposite phases, an error will result due to the incapability of the single peaking amplifier to deliver current in more than one phase direction. Proper processing can minimize and distribute this error, but to maintain a desired error level it is also important that the transition points are at sufficiently high levels. This means that the efficiency is lower than for a system consisting entirely of optimal Doherty amplifiers.

Peak reduction or clipping is used for reducing the peak to average ratio of the signals at the main amplifier transistors PA1-A-PA1-C, and joint control of several signals is used for clipping the voltage at the peak transistor PA2-C. Compared to regular peak reduction or clipping, the clipping levels of the signals to the main amplifiers are slightly higher in the present invention. This is because the error stemming from the occasional "voltages above the transition point in opposite phases" adds to the total error. To keep the total error at a desired level, some other error source must decrease, in this case the clipping error.

Compared to conventional systems, in which the amplifiers are simply dimensioned for maximum power and the clipping or peak reduction brings down the peak-to-average ratio as much as is allowed by the linearity specification, there are more degrees of freedom in the present invention. These extra degrees of freedom are created by a de-coupling of the current and voltage waveforms at the main amplifiers, due to the Doherty action with shared peaking amplifier, and the exploitation of the different joint signal statistics at the peaking amplifier.

Since there are more sources of error in the present invention, the error coming from clipping should preferably be decreased, compared to conventional system. This is achieved by dimensioning the main amplifiers' maximum output currents so that they correspond to a slightly higher clipping level. The peaking amplifier output current is then dimensioned so that it can suppress the voltage at one main amplifier, to the maximum allowed voltage, up to this value. As described previously the voltage at the peaking amplifier PA2-C is the scaled sum of all output voltages. This means that its amplitude statistics are different than those of the output voltages, generally having a Rayleigh-like distribution with higher variance, which makes clipping or peak reduction at this point gainful. The relatively small error coming from this also adds to the total error and should preferably be compensated accordingly. The tradeoff between voltage level at the peaking amplifier itself and the amount of voltage suppression at the main amplifier output nodes is performed by choosing impedances for the quarter-wave lines that form the insulating manifold.

The embodiment of FIG. 5, which uses different peaking amplifiers with common control, does not have the possibility of clipping a sum signal, and therefore requires a higher total peak amplifier power capacity to achieve the same error level and the same efficiency as the embodiment of FIG. 6.

Since the common peaking amplifier in the embodiment of FIG. 6 affects all main amplifier output node voltages, and all output (antenna) voltages affect the common peaking amplifier output node voltage, there are a couple of events that preferably should be handled:

1. When one amplifier output node voltage is above the transition voltage, the peaking amplifier output current should preferably be set to fully compensate for the excess voltage (regular Doherty operation).
2. If this compensation causes another amplifier to go above its transition voltage (into saturation), or if two amplifiers are above their transition voltages, the peaking amplifier output current should preferably be set to the minimum amplitude (adjusting also the phase) that makes both amplifiers stay below saturation.
3. If this adjustment is not possible, or if it causes a third amplifier to go into saturation, the peaking amplifier output current should preferably be set to minimize the sum of the excess voltages squared (or the peak excess voltage, if desired).

In antenna arrays the signals to different antennas are usually correlated. This correlation alters the joint signal statistics, so that coincident peaks are more commonly in the same direction. The peaking amplifier can then more often handle several amplifiers simultaneously above the transition point, which means that the transition point can be lowered and thus the efficiency substantially increased.

The invention can also use Chireix amplifiers, or the more recently invented amplifiers [3], by making them sufficiently (in the preferred embodiment maximally) asymmetrical. Thereby the amount of common signals in the peaking amplifier (the smaller of the asymmetric Chireix constituent amplifiers) is minimized. Compared to the described solution, which uses Doherty amplifiers, the asymmetric Chireix variety would have higher efficiency, but also larger difference between the main amplifier size and the peaking amplifier size.

Figure 7:
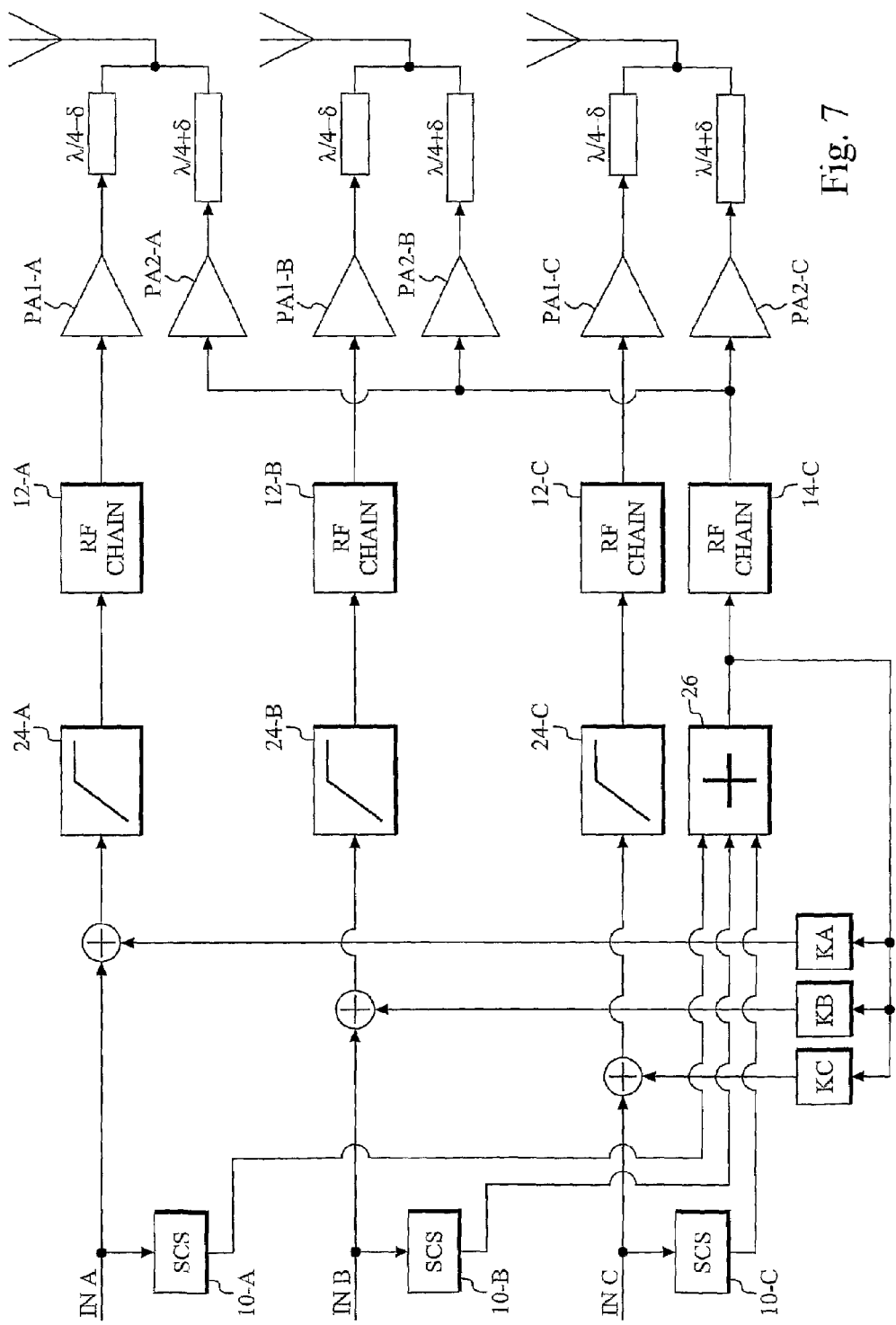
FIG. 7 is a block diagram of a third embodiment of a multiple input multiple output power amplifier system in accordance with the present invention.

FIG. 7 is a block diagram of a third embodiment of a multiple input multiple output power amplifier system in accordance with the present invention based on the Chireix principle. This embodiment is similar to the Doherty embodiment of FIG. 5 in that it uses a common RF chain 14-C and separate peaking amplifiers PA2-A, PA2-B, PA2-C. It also uses the output network 20 of FIG. 2 (although the phase shift 8 is the same for all amplifier pairs, it is also possible to have different phase shifts for the pairs). In this embodiment there is also a cross-coupling of the composite output signal from an adder 26 to the respective inputs to the main amplifiers PA1-A, PA1-B, PA1-C. Preferably these cross-coupled signals are multiplied by factors KA, KB, KC (which may be equal or different) having a magnitude of approximately 1. In a more sophisticated embodiment these factors depend on the impedances of the output network, which are also frequency dependent. The phases of the cross-coupled signals are such that the peak signal is canceled in the output signal. (Actually corresponding cross-coupling is also possible in the Doherty case, although in this case the factor magnitude is much lower.) In an asymmetric embodiment the peaking amplifiers are typically the smaller amplifiers.

Figure 8:
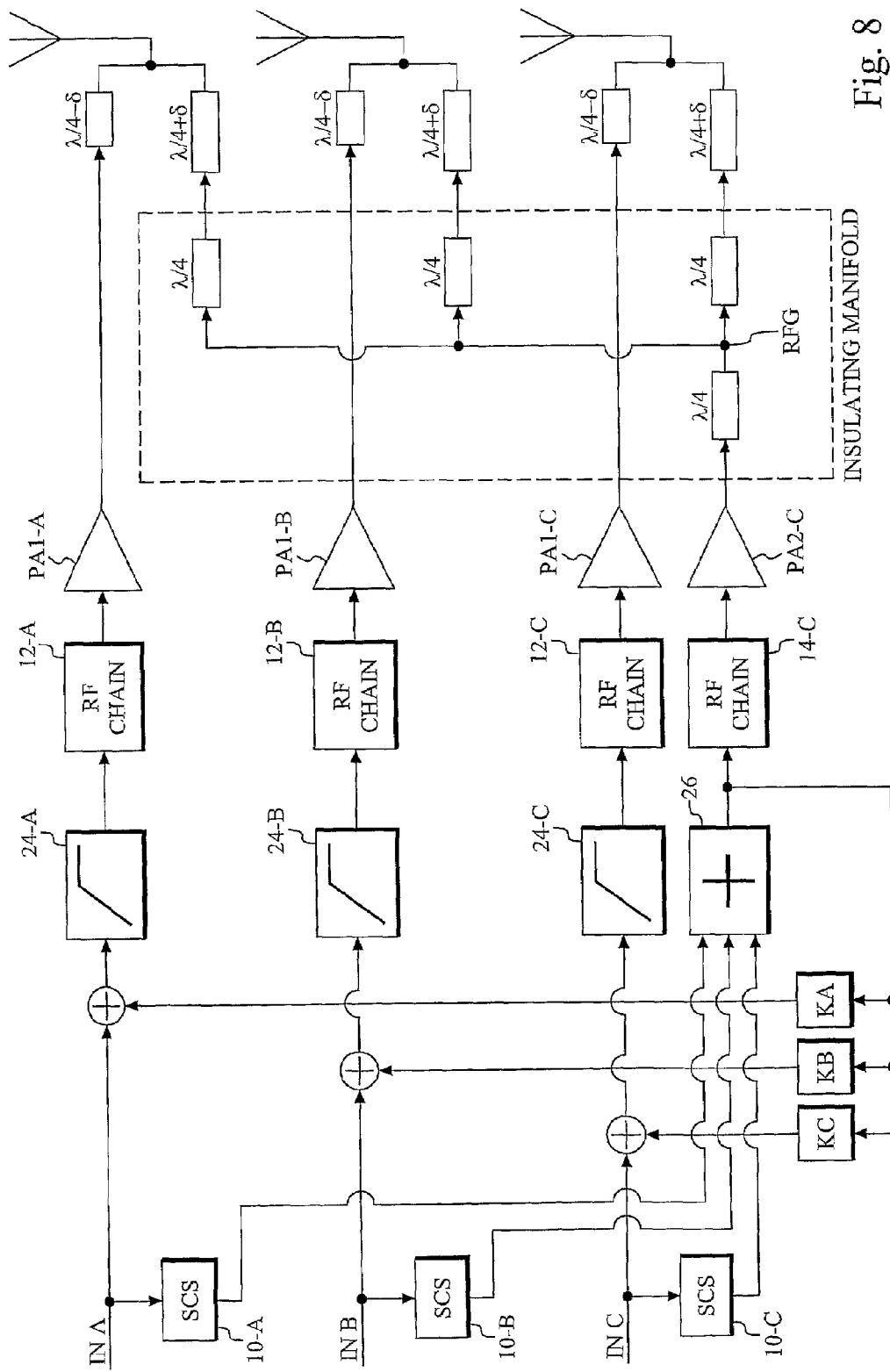
FIG. 8 is a block diagram of a fourth embodiment of a multiple input multiple output power amplifier system in accordance with the present invention.

FIG. 8 is a block diagram of a fourth embodiment of a multiple input multiple output power amplifier system in accordance with the present invention based on the Chireix principle. This embodiment is similar to the embodiment of FIG. 7, but uses a single peaking amplifier PA2-C and an insulating manifold as in the embodiment of FIG. 6. In an asymmetric embodiment the peaking amplifier is typically the smaller amplifier.

The description given above has illustrated the present invention by comparing it to a prior art system including three composite amplifiers, each including two power amplifiers with corresponding control paths. However, it is appreciated that the number of composite amplifiers in the prior art system to be replaced by the present invention may be two or more than three, and that the composite amplifiers may include more than two power amplifiers with corresponding control paths (as in [4]). The larger the number of composite amplifiers, the greater are the savings made possible by the present invention.

In the following example illustrating the efficiency of the present invention, an amplifier system in accordance with the invention is compared to a reference system of equal complexity. Three independent signals with 9-dB Rayleigh-distributed amplitudes are amplified in both cases. Both systems are designed to have the same total error level, −47 dBc. In the reference system, this is caused entirely by clipping the signals at 9 dB above the average power level. In the system according to the invention the equivalent clipping level for a single amplifier (caused by insufficient peaking amplifier output current) is at 1.05 compared to the 9 dB-level. The transition point is at 0.73 of the 9-dB-level (One could say that the main amplifiers are designed to be Doherty amplifiers with transition points at 0.695.).

The reference system uses two class B amplifiers and one optimal two-transistor Doherty amplifier, all with a maximum output power of one. The optimal Doherty amplifier is made of amplifiers with maximum output powers of 0.38 and 0.62. The system according to the invention uses three main amplifiers with a maximum output power of 0.75 and a peaking amplifier with a maximum output power of 0.57. The number of control paths (up-converters) is the same, 4, in both cases (equal complexity).

The sum of output powers for the system according to the invention is in this case 94% of that of the reference system, a reduction by 6%. The average efficiency of the reference system is 37.5%, since its class B amplifiers have an efficiency of 31.4% and its Doherty amplifier an efficiency of 61.6%. The efficiency of the system according to the invention is 42.7%, a substantial improvement over the reference system. In this example we thus need less total output power and get higher efficiency than in the reference system.

The described invention has several advantages, for example:

Higher efficiency for the same hardware complexity.
Lower total output power needed.
New tradeoffs between complexity and efficiency possible.
Efficiency extra high in antenna array applications.

It will be understood by those skilled in the art that various modifications and changes may be made to the present invention without departure from the scope thereof, which is defined by the appended claims.

REFERENCES

[1] H. Chireix, "High Power Outphasing Modulation", Proc. IRE, vol. 23, no. 2, pp. 1370-1392, Nov. 1935.
[2] W. H. Doherty, "A New High Efficiency Power Amplifier for Modulated Waves", Proc. IRE, vol. 24, no. 9, pp. 1163-1182, Sep. 1936.
[3] WO 03/061115 A1.
[4] WO 04/057755 A1.

The invention claimed is:

1. A multiple input multiple output power amplifier system, comprising:
    multiple main amplifiers for amplifying corresponding independent input signals;
    means for forming a composite signal from the independent input signals;
    means for amplifying the composite signal, said means for amplifying the composite signal including a plurality of multiple peaking power amplifiers, each amplifying said composite signal; and
    an output network for combining main amplifier output signals with amplified composite signals into multiple power amplifier system output signals.

2. A multiple input multiple output power amplifier system, comprising:
    multiple main amplifiers for amplifying corresponding independent input signals;
    means for farming a composite signal from the independent input signals;
    means for amplifying the composite signal, said means for amplifying the composite signal including a single peaking power amplifier for amplifying said composite signal; and
    an output network for combining main amplifier output signals with amplified composite signals into multiple power amplifier system output signals.

3. The amplifier system of claim 2, wherein said output network includes a radio frequency insulating manifold connected to the peaking power amplifier, said insulating manifold including a quarter wave-length transmission line connected to a plurality of quarter wave-length transmission lines.

4. A multiple input multiple output cower amplifier system. comprising:
    multiple main amplifiers for amplifying corresponding independent input signals;
    means for forming a composite signal from said independent input signals;
    means for amplifying said composite signal, wherein a scaled version of said composite signal is cross-coupled to each main amplifier input; and
    an output network for combining main amplifier output signals with amplified composite signals into multiple power amplifier system output signals.

5. A radio frequency insulating manifold for distributing an output current of a peaking amplifier to a plurality of output nodes while insulating the plurality of output nodes from each other, said insulating manifold comprising:
    a plurality of quarter wave-length transmission lines, each quarter wave-length transmission line connecting a different one of the plurality of output nodes to a common radio frequency around (RFG) point for insulating the output nodes from each other; and
    an output quarter wave-length transmission line connected to the output of the peaking amplifier and to the common RFG point.

* * * * *

UNITED STATES PATENT AND TRADEMARK OFFICE
CERTIFICATE OF CORRECTION

PATENT NO. : 7,557,652 B2  
APPLICATION NO. : 11/722191  
DATED : July 7, 2009  
INVENTOR(S) : Klingberg et al.

Page 1 of 1

It is certified that error appears in the above-identified patent and that said Letters Patent is hereby corrected as shown below:

In Column 1, Line 31, delete "therefor" and insert -- therefore --, therefor.

In Column 6, Line 1, delete "8" and insert -- δ --, therefor.

In Column 7, Line 39, in Claim 2, delete "farming" and insert -- forming --, therefor.

In Column 8, Line 14, in Claim 4, delete "cower" and insert -- power --, therefor.

In Column 8, Line 14, in Claim 4, delete "system." and insert -- system, --, therefor.

In Column 8, Line 34, in Claim 5, delete "around" and insert -- ground --, therefor.

Signed and Sealed this

Twenty-fourth Day of November, 2009

David J. Kappos  
*Director of the United States Patent and Trademark Office*